(12) United States Patent
Hu et al.

(10) Patent No.: US 10,115,712 B2
(45) Date of Patent: Oct. 30, 2018

(54) ELECTRONIC MODULE

(71) Applicant: Siliconware Precision Industries Co., Ltd., Taichung (TW)

(72) Inventors: Shao-Chueh Hu, Taichung (TW); Yueh-Chiung Chang, Taichung (TW); Don-Son Jiang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 98 days.

(21) Appl. No.: 14/998,114

(22) Filed: Dec. 24, 2015

(65) Prior Publication Data

US 2017/0048981 A1 Feb. 16, 2017

(30) Foreign Application Priority Data

Aug. 12, 2015 (TW) .............. 104126217 A

(51) Int. Cl.
*H01L 25/11* (2006.01)
*H05K 7/02* (2006.01)
*H01Q 3/44* (2006.01)

(52) U.S. Cl.
CPC .................. *H01L 25/117* (2013.01)

(58) Field of Classification Search
CPC .......... H05K 7/023; H05K 7/06; H05K 1/182; H05K 1/183; H01L 25/117; H01Q 3/44–3/46
See application file for complete search history.

(56) References Cited

U.S. PATENT DOCUMENTS

| 7,049,682 | B1 * | 5/2006 | Mathews | H01L 23/552 257/659 |
| 9,172,131 | B2 * | 10/2015 | Chen | H01Q 1/2283 |
| 2014/0252595 | A1 * | 9/2014 | Yen | H01L 23/498 257/737 |
| 2014/0320376 | A1 * | 10/2014 | Ozdemir | H01Q 9/0442 343/876 |

* cited by examiner

*Primary Examiner* — Hoa C Nguyen

(74) *Attorney, Agent, or Firm* — Mintz Levin Cohn Ferris Glovsky and Popeo, P.C.; Peter F. Corless; Steven M. Jensen

(57) ABSTRACT

An electronic module is provided, which includes a first package and a second package stacked on the first package. The first package has an encapsulant and an electronic element embedded in the encapsulant. The second package has an insulating layer and an antenna structure formed on and extending through the insulating layer. The insulating layer is bonded to the encapsulant with the antenna structure being electrically connected to the electronic element. Since the second package having the antenna structure is stacked on the first package, the invention eliminates the need to increase the area of the first package for mounting the antenna structure and hence allows the electronic module to meet the miniaturization requirement.

7 Claims, 3 Drawing Sheets

ELECTRONIC MODULE

CROSS-REFERENCES TO RELATED APPLICATIONS

This application claims under 35 U.S.C. § 119(a) the benefit of Taiwanese Application No. 104126217, filed Aug. 12, 2015, the entire contents of which are incorporated herein by reference.

BACKGROUND OF THE INVENTION

1. Field of the Invention

The present invention relates to electronic modules, and more particularly, to an electronic module having an antenna.

2. Description of Related Art

Along with the rapid development of electronic industries, electronic products are developed toward the trend of multi-function and high performance. Wireless communication technologies have been widely applied in various kinds of consumer electronic products for receiving or transmitting various wireless signals. To meet the miniaturization requirement of consumer electronic products, wireless communication modules are becoming lighter, thinner, shorter and smaller. For example, patch antennas have been widely applied in wireless communication modules of electronic products such as cell phones and personal digital assistants (PDAs) due to their advantages of small size, light weight and easy fabrication.

FIG. 1 is a schematic perspective view of a conventional wireless communication module. Referring to FIG. 1, the wireless communication module 1 has: a circuit board 10, a plurality of electronic elements 11 disposed on and electrically connected to the circuit board 10, an antenna structure 12 formed on the circuit board 10, and an encapsulant 13. The circuit board 10 has a rectangular shape. The antenna structure 12 is of a planar type. The antenna structure 12 has an antenna body 120 and a conductive wire 121 electrically connecting the antenna body 120 and the electronic elements 11. The encapsulant 13 encapsulates the electronic elements 11 and a portion of the conductive wire 121.

However, during the fabrication process of the wireless communication module 1, the antenna body 120 of the antenna structure 12 cannot be integrally fabricated with the electronic elements 11 due to the characteristic of electromagnetic radiation between the antenna structure 12 and the electronic elements 11 and limitation of the size of the planar-type antenna structure 12. As such, the electronic elements 11 are covered by the encapsulant 13, but the antenna body 120 of the antenna structure 12 is exposed from the encapsulant 13. Therefore, the molding process for forming the encapsulant 13 needs a mold having a size corresponding to the electronic element-mounting area. Further, since the surface of the circuit board 10 needs an additional area for forming the antenna body 120 (i.e, an area where the encapsulant 13 is not to be formed), the size of the circuit board 10 and thus the size of the wireless communication module 1 are increased. Consequently, the wireless communication module 1 cannot meet the miniaturization requirement.

Furthermore, high-frequency RF chips are usually used as electronic elements 11. When they are positioned adjacent to digital chips, digital signal processors or baseband chips, electromagnetic interferences (EMIs) easily occur.

Therefore, how to overcome the above-described drawbacks has become critical.

SUMMARY OF THE INVENTION

In view of the above-described drawbacks, the present invention provides an electronic module, which comprises: a first package having an encapsulant and an electronic element embedded in the encapsulant, wherein the encapsulant has opposite first and second surfaces; and a second package disposed on the first surface of the encapsulant, wherein the second package has an insulating layer having opposite third and fourth surfaces and an antenna structure formed on the third surface of the insulating layer and extending through the insulating layer, the insulating layer being bonded to the first surface of the encapsulant via the fourth surface thereof and the antenna structure being electrically connected to the electronic element.

In an embodiment, a circuit structure is formed on the first surface of the encapsulant for electrically connecting the electronic element and the antenna structure.

In an embodiment, a plurality of conductive through holes are formed in the encapsulant, communicating the first and second surfaces of the encapsulant and electrically connected to the antenna structure or the electronic element.

In an embodiment, the electronic element is positioned adjacent to the first surface or the second surface of the encapsulant.

In an embodiment, a circuit structure is formed on the second surface of the encapsulant and electrically connected to the electronic element.

In an embodiment, a metal layer is formed on the fourth surface of the insulating layer and electrically connected to the antenna structure.

In an embodiment, the antenna structure has an antenna body formed on the third surface of the insulating layer, and a conductor formed in the insulating layer, communicating the third and fourth surfaces of the insulating layer and electrically connected to the antenna body.

In an embodiment, the second package is disposed on the first surface of the encapsulant through a plurality of conductive elements.

The above-described electronic module can further comprise a plurality of conductive elements formed on the second surface of the encapsulant.

Since the second package having the antenna structure is stacked on the first package, the present invention increases the space for mounting the antenna structure without the need to increase the size of the first package. Therefore, the electronic module of the present invention meets the miniaturization requirement.

BRIEF DESCRIPTION OF DRAWINGS

FIG. 2' is a schematic upper view of an antenna body of FIG. 2; and

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 1:
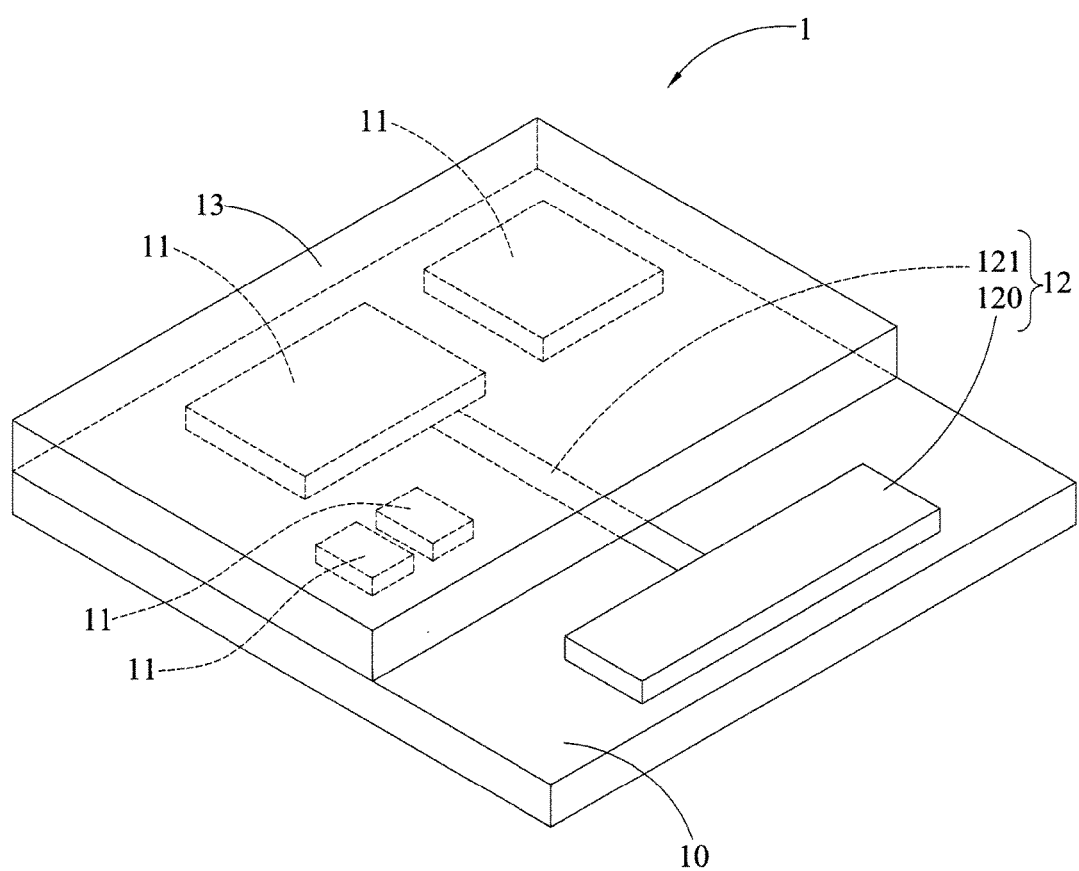
FIG. 1 is a schematic perspective view of a conventional wireless communication module.
Figure 2:
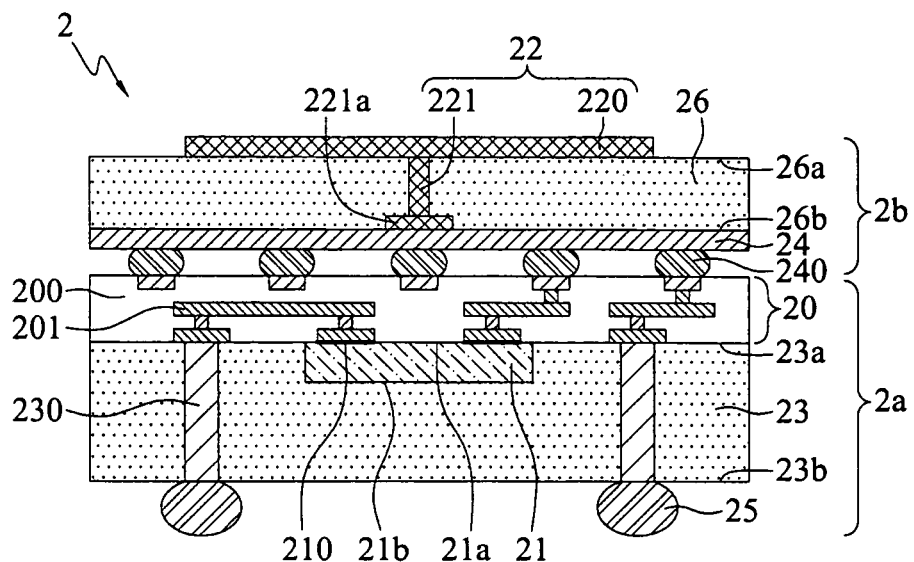
FIG. 2 is a schematic cross-sectional of an electronic module according to a first embodiment of the present invention.
Figure 2:
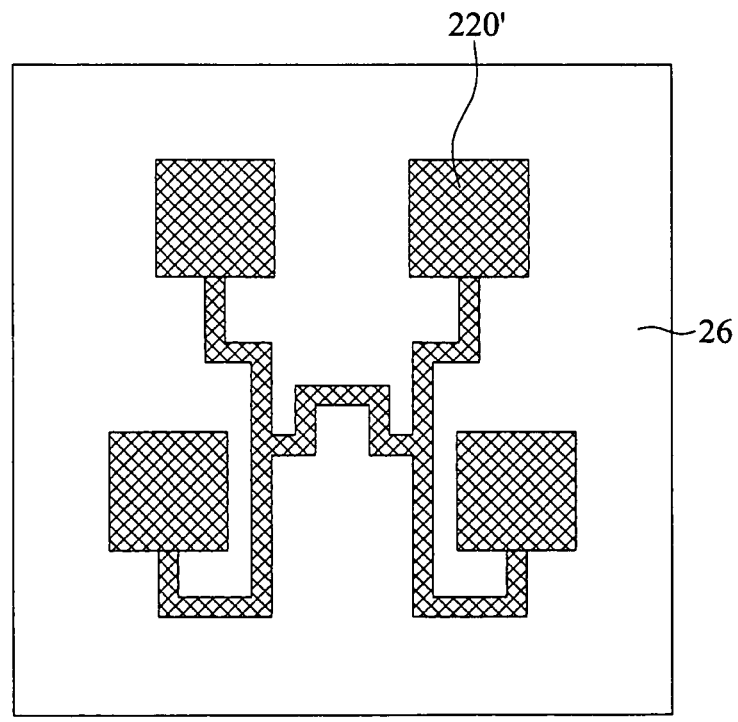

FIG. 2 is a schematic cross-sectional of an electronic module 2 according to a first embodiment of the present invention.

Referring to FIG. 2, the electronic module 2 is a SiP (system in package) wireless communication module. The electronic module 2 has a first package 2a and a second package 2b stacked on the first package 2a.

The first package 2a has an encapsulant 23, an electronic element 21 embedded in the encapsulant 23, and a first circuit structure 20 formed on the encapsulant 23. The encapsulant 23 has a first surface 23a and a second surface 23b opposite to the first surface 23a. The electronic element 21 is positioned adjacent to the first surface 23a of the encapsulant 23 and the first circuit structure 20 is formed on the first surface 23a of the encapsulant 23.

In the present embodiment, the first circuit structure 20 has at least a first dielectric layer 200 and a plurality of first circuit layers 201 formed on the first dielectric layer 200. For example, the first circuit structure 20 is a packaging substrate or a built-up circuit structure, and the first circuit layers 201 are fan-out redistribution layers.

A plurality of conductive through holes 230 are formed in the encapsulant 23, communicating the first surface 23a and the second surface 23b of the encapsulant 23 and electrically connected to the first circuit layers 201. The conductive through holes 230 can be formed through a through molding via (TMV) process.

The electronic element 21 is an active element such as a semiconductor chip, a passive element such as a resistor, a capacitor or an inductor, or a combination thereof. In the present embodiment, the electronic element 21 is an active element having an active surface 21a with a plurality of electronic pads 210 and an inactive surface 21b opposite to the active surface 21a. The active surface 21a of the electronic element 21 is exposed from the first surface 23a of the encapsulant 23 and the electrode pads 210 of the electronic element 21 are electrically connected to the first circuit layers 201. As such, the conductive through holes 230 are electrically connected to the electronic element 21 through the first circuit layers 201.

Further, a plurality of conductive elements 25 are formed on the second surface 23a of the encapsulant 23 and electrically connected to the conductive through holes 230. As such, the first package 2a can be disposed on an electronic device such as a circuit board (not shown) through the conductive elements 25. The conductive elements 25 are solder balls, or metal bumps, such as copper posts.

To fabricate the first package 2a, the electronic element 21 can be disposed on the first circuit structure 20 first and then the encapsulant 23 can be formed to encapsulate the electronic element 21.

The second package 2b has an insulating layer 26, and an antenna structure 22 and a metal layer 24 formed on two opposite sides of the insulating layer 26, respectively. The insulating layer 26 has a third surface 26a and a fourth surface 26b opposite to the third surface 26a. The antenna structure 22 is formed on the third surface 26a of the insulating layer 26 and the metal layer 24 is formed on the fourth surface 26b of the insulating layer 26. The insulating layer 26 is bonded to the first surface 23a of the encapsulant 23 via the fourth surface 26b (and the metal layer 24) thereof. The antenna structure 22 extends through the insulating layer 26 so as to be electrically connected to the metal layer 24.

In the present embodiment, the insulating layer 26 is made of a dielectric material having a low dissipation factor or high dielectric constant, for example, a ceramic material, which allows the antenna structure to have a low energy loss or small size. Since there is no limitation on selection of the materials of the insulating layer 26 and the encapsulant 23, the present invention achieves high integration and low cost.

Further, a plurality of conductive elements 240 are formed on the metal layer 24 and the second package 2b is disposed on the first surface 23a of the encapsulant 23 through the conductive elements 240. The conductive elements 240 are solder balls, or metal bumps, such as copper posts.

The antenna structure 22 is made of metal. The antenna structure 22 has an antenna body 220 formed on the third surface 26a of the insulating layer 26, and a conductor 221 formed in the insulating layer 26 and communicating the third surface 26a and the fourth surface 26b of the insulating layer 26 for electrically connecting the antenna body 220 and the metal layer 24. Preferably, the conductor 221 has a conductive pad 221a in contact with the metal layer 24. Therefore, the antenna structure 22 is electrically connected to the first circuit layers 201 through the metal layer 24 and the conductive elements 240 so as to be electrically connected to the electronic element 21 and the conductive through holes 230.

The shape of the antenna body 220 can be varied according to the practical need. In the present embodiment, referring to FIG. 2, the antenna body 220 has a sheet shape. In another embodiment, referring to FIG. 2', the antenna body 220' has a patterned shape.

According to the present invention, the metal layer 24 of a large size is connected to the ground terminal of the first circuit structure 20 to achieve an EMI-shielding purpose.

Further, the second package 2b can have one or more antenna radiation cells and radiation signals are directly provided by the first package 2a so as to minimize the loss.

Figure 3:
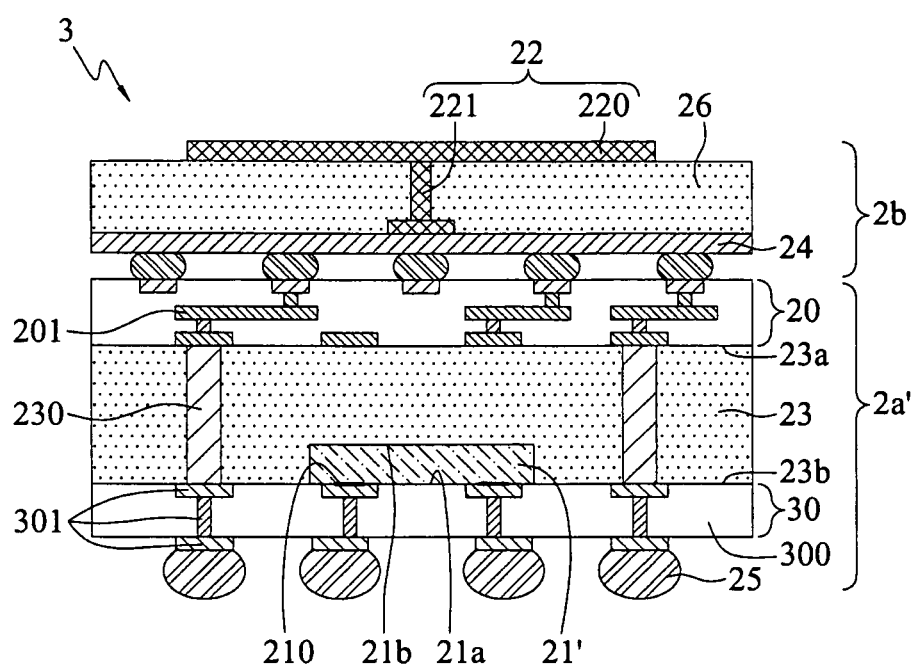
FIG. 3 is a schematic cross-sectional view of an electronic module according to a second embodiment of the present invention.

FIG. 3 is a schematic cross-sectional view of an electronic module 3 according to a second embodiment of the present invention. The second embodiment differs from the first embodiment in the arrangement of the electronic element 21'.

Referring to FIG. 3, the electronic element 21' is disposed adjacent to the second surface 23b of the encapsulant 23. In particular, the active surface 21a of the electronic element 21' is exposed from the second surface 23b of the encapsulant 23.

In the present embodiment, the first package 2a' has a second circuit structure 30 formed on the second surface 23b of the encapsulant 23. The second circuit structure 30 has at least a second dielectric layer 300 and a plurality of second circuit layers 301 formed on the second dielectric layer 300 and electrically connecting the conductive through holes 230 and the electrode pads 210 of the electronic element 21'. As such, the electronic element 21' is electrically connected to the first circuit layers 201 and further electrically connected to the antenna structure 22.

According to the present invention, a second package 2b having an antenna structure 22 and an EMI-shielding metal layer 24 is provided. The second package 2b is stacked on a first package 2a, 2a' so as to increase the space for mounting the antenna structure 22 without the need to occupy the area of the first circuit structure 20. Therefore, the electronic module 2, 3 of the present invention meets the miniaturization requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic module, comprising:
a first package having an encapsulant and an electronic element embedded in the encapsulant, wherein the encapsulant has opposite first and second surfaces, wherein a first circuit structure has a dielectric layer formed on the first surface of the encapsulant and at least a circuit layer formed on the dielectric layer for electrically connecting the electronic element; and
a second package disposed on the first circuit structure formed on the first surface of the encapsulant through a plurality of conductive elements, wherein the second package has an insulating layer having opposite third and fourth surfaces and an antenna structure formed on the third surface of the insulating layer and extending through the insulating layer, the insulating layer being bonded to the first surface of the encapsulant via the fourth surface thereof and the antenna structure being electrically connected to the circuit layer and the electronic element, wherein a metal layer is formed on the fourth surface of the insulating layer and electrically connected to the antenna structure and at least one of the conductive elements, and wherein the metal layer is free from being in contact with the first circuit structure.

2. The module of claim 1, wherein a plurality of conductive through holes are formed in the encapsulant, communicating the first and second surfaces of the encapsulant and electrically connected to the antenna structure, the circuit layer, or the electronic element.

3. The module of claim 1, wherein the electronic element is positioned adjacent to the first surface of the encapsulant.

4. The module of claim 1, wherein the electronic element is positioned adjacent to the second surface of the encapsulant.

5. The module of claim 1, wherein a second circuit structure is formed on the second surface of the encapsulant and electrically connected to the electronic element.

6. The module of claim 1, wherein the antenna structure has:
an antenna body formed on the third surface of the insulating layer; and
a conductor formed in the insulating layer, communicating the third and fourth surfaces of the insulating layer and electrically connected to the antenna body.

7. The module of claim 1, further comprising a plurality of another conductive elements formed on the second surface of the encapsulant.

* * * * *